(12) United States Patent
Ahmed et al.

(10) Patent No.: US 9,373,516 B2
(45) Date of Patent: Jun. 21, 2016

(54) METHOD AND APPARATUS FOR FORMING GATE STACK ON SI, SIGE OR GE CHANNELS

(71) Applicants: Khaled Z. Ahmed, Anaheim, CA (US); Steven Hung, Sunnyvale, CA (US); Kaushal K. Singh, Santa Clara, CA (US); Sundar Ramamurthy, Fremont, CA (US)

(72) Inventors: Khaled Z. Ahmed, Anaheim, CA (US); Steven Hung, Sunnyvale, CA (US); Kaushal K. Singh, Santa Clara, CA (US); Sundar Ramamurthy, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 319 days.

(21) Appl. No.: 14/016,027

(22) Filed: Aug. 30, 2013

(65) Prior Publication Data
US 2014/0065798 A1 Mar. 6, 2014

Related U.S. Application Data

(60) Provisional application No. 61/695,748, filed on Aug. 31, 2012.

(51) Int. Cl.
| | |
|---|---|
| *H01L 21/322* | (2006.01) |
| *H01L 21/30* | (2006.01) |
| *H01L 21/67* | (2006.01) |
| *H01L 21/28* | (2006.01) |
| *H01L 21/02* | (2006.01) |
| *H01L 21/306* | (2006.01) |
| *H01L 29/66* | (2006.01) |

(52) U.S. Cl.
CPC ...... *H01L 21/3003* (2013.01); *H01L 21/02164* (2013.01); *H01L 21/02301* (2013.01); *H01L 21/02315* (2013.01); *H01L 21/2822* (2013.01); *H01L 21/28194* (2013.01); *H01L 21/28255* (2013.01); *H01L 21/306* (2013.01); *H01L 21/6715* (2013.01); *H01L 21/67207* (2013.01); *H01L 29/66545* (2013.01)

(58) Field of Classification Search
CPC ............... H01L 21/3003; H01L 21/02164; H01L 21/02301; H01L 21/02315; H01L 21/28194; H01L 21/2822; H01L 21/306; H01L 21/6715; H01L 21/67207; H01L 29/66545
USPC .......................... 438/475, 473, 477, 795, 798
See application file for complete search history.

(56) References Cited

U.S. PATENT DOCUMENTS

| | | | |
|---|---|---|---|
| 5,186,718 A | 2/1993 | Tepman et al. | |
| 2004/0242021 A1 | 12/2004 | Kraus et al. | |
| 2010/0080932 A1* | 4/2010 | Kim ................. | G01N 33/54353 427/558 |
| 2013/0035498 A1* | 2/2013 | Maldonado ........... | C30B 29/406 556/13 |
| 2015/0023840 A1* | 1/2015 | Kinz-Thompson | G01N 33/54393 422/82.11 |

\* cited by examiner

*Primary Examiner* — Kevin M Picardat
(74) *Attorney, Agent, or Firm* — Servilla Whitney LLC

(57) ABSTRACT

Provided are methods and apparatus for functionalizing a substrate surface used as the channel in a gate stack. Silicon, germanium and silicon germanium substrates surfaces are functionalized with one or more of sulfur and selenium by plasma processing.

18 Claims, 3 Drawing Sheets

METHOD AND APPARATUS FOR FORMING GATE STACK ON SI, SIGE OR GE CHANNELS

CROSS-REFERENCE TO RELATED APPLICATIONS

This application claims the benefit of U.S. Provisional Application No. 61/695,748, filed Aug. 31, 2013.

BACKGROUND

Embodiments of the invention generally relate to an apparatus and methods for forming a gate stack on a silicon, germanium or silicon germanium channel. More specifically, embodiments of the invention are directed to methods and apparatus for functionalizing the silicon, germanium, or silicon germanium substrate surface with one or more of sulfur and selenium to stabilize the surface bonds.

Integrated circuits may include more than one million micro-electronic field effect transistors (e.g., complementary metal-oxide-semiconductor (CMOS) field effect transistors) that are formed on a substrate and cooperate to perform various functions within the circuit. A CMOS transistor comprises a gate structure disposed over a channel region formed between source and drain regions of the transistor. The gate structure generally comprises a gate electrode and a gate dielectric. The gate electrode is disposed over the gate dielectric and, in operation, is used to control a flow of charge carriers (i.e., electric current) in the channel region beneath the gate dielectric.

Germanium is an attractive channel material for future CMOS devices, since both electron and hole mobilities are higher than those of silicon. An important technical issue associated with the use of germanium concerns the passivation of the germanium surface. Although high hole and electron mobility were reported for p-FET and n-FET with germanium channels with a germanium dioxide ($GeO_2$) interfacial layer, the thermal instability of the germanium dioxide has been found to be an origin of a significant increase in gate leakage. Therefore, there is a need in the art for an interface passivation layer for germanium CMOS manufacture. Additionally, there is a need in the art for apparatus, methods and hardware platforms to achieve such an alternative passivation layer.

SUMMARY

One or more embodiments of the invention are directed to methods of functionalizing a substrate surface. The methods comprise exposing a clean surface of the substrate to a functionalizing element to form a functionalized substrate surface. The substrate being selected from the group consisting of silicon, germanium and silicon germanium, and the functionalizing element selected from the group consisting of sulfur, selenium and mixtures thereof.

In some embodiments, the functionalizing element comprises sulfur. In one or more embodiments, the atomic sulfur is generated by a plasma of one or more of hydrogen sulfide and sulfur selenide.

In some embodiments, the functionalizing element comprises selenium. In one or more embodiments, the selenium is generated by a plasma of one or more of hydrogen selenide and sulfur selenide. In some embodiments, the plasma is pulsed.

Some embodiments further comprise exposing the substrate surface to an atomic hydrogen cleaning process to form the clean substrate surface. In one or more embodiments, the clean substrate surface is exposed to the functionalizing element without exposure to oxygen.

Some embodiments further comprise forming a silicon dioxide film on the functionalized substrate surface. One or more embodiments further comprise forming a silicon film on the functionalized substrate surface. Some embodiments further comprise forming a silicon dioxide film on the silicon film.

Additional embodiments of the invention are directed to methods of forming a gate stack on a surface of a substrate. The methods comprise cleaning the surface of the substrate with an atomic hydrogen cleaning process to form a clean substrate surface. The clean substrate surface is functionalized with a functionalizing element to form a functionalized substrate surface, the functionalizing element selected from the group consisting of sulfur, selenium and mixtures thereof. A silicon dioxide layer is formed on the functionalized substrate surface, wherein the substrate is selected from the group consisting of silicon, germanium and silicon germanium and the substrate is not exposed to ambient conditions until after forming the silicon dioxide layer.

Some embodiments further comprise forming a silicon layer between the functionalized substrate surface and the silicon dioxide layer.

In one or more embodiments, each of the cleaning, functionalizing and forming of a silicon dioxide layer are performed in separate processing chambers, each chamber attached to a centralized transfer chamber and moved between the chambers by a robot without exposure to the ambient environment.

Further embodiments of the invention are directed to cluster tools comprising a central transfer station, a load lock, an atomic hydrogen cleaning chamber, a functionalizing chamber and a first atomic layer deposition chamber. The central transfer station includes a robot to move a substrate between one or more processing chambers and load lock chambers. The load lock is connected to a front of the central transfer station. The load lock forming a barrier between the central transfer station and the ambient environment. The atomic hydrogen cleaning chamber is connected to the central transfer station. The functionalization chamber is in fluid communication with a functionalizing gas and connected to the central transfer station. The functionalizing gas being one or more of hydrogen selenide, hydrogen sulfide and sulfur selenide. The functionalization chamber includes a plasma generator to form a plasma of the functionalization gas. The first atomic layer deposition chamber is connected to the central transfer station to deposit a silicon dioxide film.

Some embodiments further comprise a second atomic layer deposition chamber connected to the central transfer station to deposit a silicon film.

BRIEF DESCRIPTION OF THE DRAWINGS

So that the manner in which the above recited features of the invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the invention are directed to methods and apparatus for functionalizing a substrate surface. For example, atomic sulfur and/or atomic silver are reacted with the surface of a clean silicon, germanium or silicon germanium wafer. In one or more embodiments of the invention, after cleaning a substrate (e.g., Si, SiGe or Ge) surface using an "Atomic Hydrogen Clean," the wafer is exposed to one or more of S or Se in a chamber where plasma is introduced to break, for example, $H_2S$ or $H_2Se$ bonds to form atomic S, molecular S, atomic Se or molecular Se. This is referred to as "functionalization." After functionalization, a thin silicon or silicon dioxide layer (thickness ~0.6 nm) is deposited using Atomic Layer Deposition (ALD). A sacrificial silicon dioxide layer of thickness about 1.5-2.0 nm is deposited using atomic layer deposition (for gate last flow). This stack may be processed without an air break using, for example, a clustered system.

As used in this specification and the appended claims, the term "substrate" and "wafer" are used interchangeably, both referring to a surface, or portion of a surface, upon which a process acts. It will also be understood by those skilled in the art that reference to a substrate can also refer to only a portion of the substrate, unless the context clearly indicates otherwise. Additionally, reference to depositing (or deposition) on a substrate can mean both a bare substrate and a substrate with one or more films or features formed thereon. For example, a discrete silicon wafer can have an epitaxially grown film of germanium thereon. The epitaxially formed germanium film is referred to as a substrate for the subsequent processing steps.

Figure 1A:
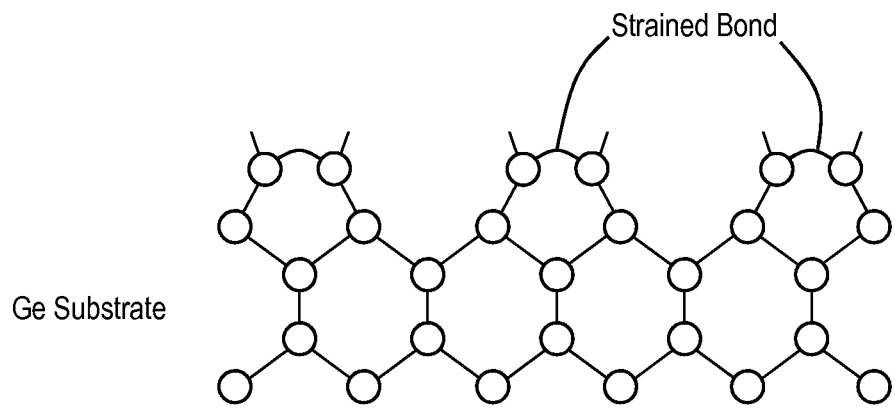
FIG. 1A shows a crystal structure for a strained germanium substrate.
Figure 1B:
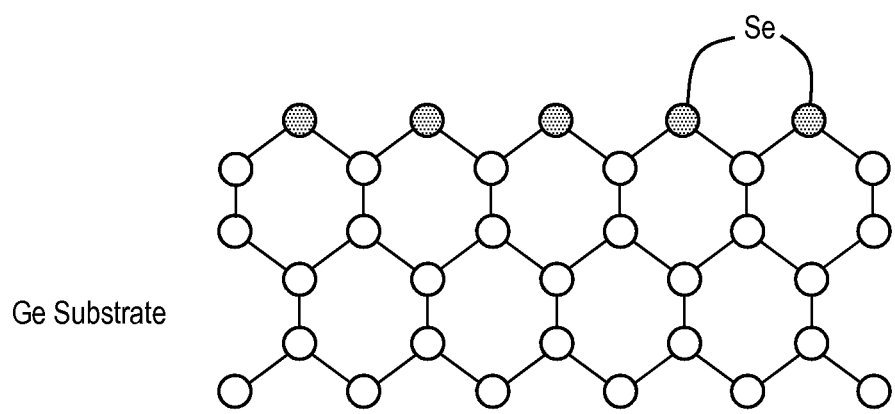
FIG. 1B shows a crystal structure for a selenium functionalized germanium substrate in accordance with one or more embodiment of the invention.

One or more embodiments of the invention are directed to methods of functionalizing a substrate surface. A clean substrate surface is exposed to a functionalizing element. As used in this specification and the appended claims, the term "functionalizing element" refers to a species, either molecular or atomic, that reacts with the substrate surface to, for example, stabilize the substrate structure. The functionalizing element can be any suitable compound or element that can react with the substrate surface without interfering with subsequent processing. Without being bound by any particular theory of operation, it is believed that the functionalizing element relieves strain on the substrate surface. FIG. 1A shows a representation of the crystal structure of a bare germanium substrate. The atoms at the surface of the substrate are weakly bonded with a strained bond (also referred to as an interface trap). FIG. 1B shows the same germanium substrate with selenium atoms bridging the germanium atoms previously strained. It is believed that the selenium relieves strain on the substrate resulting in a thermally stable interface passivation layer.

The substrate can be any suitable substrate that has a strained interfacial region resulting in instability of deposited films. In some embodiments, the substrate is one or more of silicon (Si), germanium (Ge) and silicon germanium (SiGe). As used in this specification and the appended claims, the term "silicon germanium" refers to an alloy of silicon and germanium. The ratio of the silicon to germanium can range from completely silicon to completely germanium. In some embodiments, the substrate is silicon. In some embodiments, the substrate is germanium. In some embodiments, the substrate is a silicon germanium alloy.

In some embodiments, the substrate is a crystalline material. In some embodiments, the substrate is an epitaxially grown film on a discrete substrate. For example, the substrate may be a germanium film epitaxially grown on a silicon wafer. In some embodiments, the substrate is an epitaxially grown silicon film on a silicon substrate. In some embodiments, the substrate is an epitaxially grown silicon germanium alloy grown on a discrete crystalline substrate.

The functionalizing element can be any suitable element capable of relieving surface strain on the substrate without interfering with subsequent processing. Interference can be any detrimental impact on the subsequent film, or the prevention of the formation of a subsequent film. In some embodiments, the functionalizing element is a chalcogen other than oxygen (e.g., sulfur, selenium, tellurium). In one or more embodiments, the functionalizing element is selected from the group consisting of atomic sulfur, molecular sulfur, atomic selenium, molecular selenium and combinations or mixtures thereof. In some embodiments the functionalizing element is sulfur. In some embodiments, the functionalizing element is selenium. The term "atomic sulfur" or "atomic selenium" may be used to describe the functionalizing element, but it will be understood by those skilled in the art that the functionalizing element can be a molecular species like molecular sulfur and molecular selenium.

In some embodiments, the functionalizing element is a mixture of sulfur and selenium. The ratio of sulfur to selenium can range from purely sulfur to purely selenium. In some embodiments, the S:Se ratio is in the range of about 100:1 to 1:100, or in the range of about 80:1 to about 1:80, or in the range of about 60:1 to about 1:60, or in the range of about 40:1 to about 1:40, or in the range of about 20:1 to about 1:20, or in the range of about 10:1 to about 1:10 or in the range of about 5:1 to about 1:5 or about 1:1.

The source of the functionalizing element can be any suitable source. In some embodiments, hydrogen sulfide ($H_2S$) can be used as a source for sulfur. A hydrogen sulfide plasma can result in breaking of the hydrogen to sulfur bonds releasing the sulfur for interaction with the substrate. In one or more embodiments, sulfur is generated by a plasma of hydrogen sulfide. In some embodiments, hydrogen selenide ($H_2Se$) is the source for selenium. In one or more embodiments, selenium is generated by a plasma of hydrogen selenide. In some embodiments, sulfur selenide (SSe) is the source for sulfur, selenium or both. In one or more embodiments, sulfur, selenium or both are generated by a plasma of sulfur selenide. The plasma of either hydrogen sulfide, hydrogen selenide or sulfur selenide can be continuous or pulsed.

Figure 2:
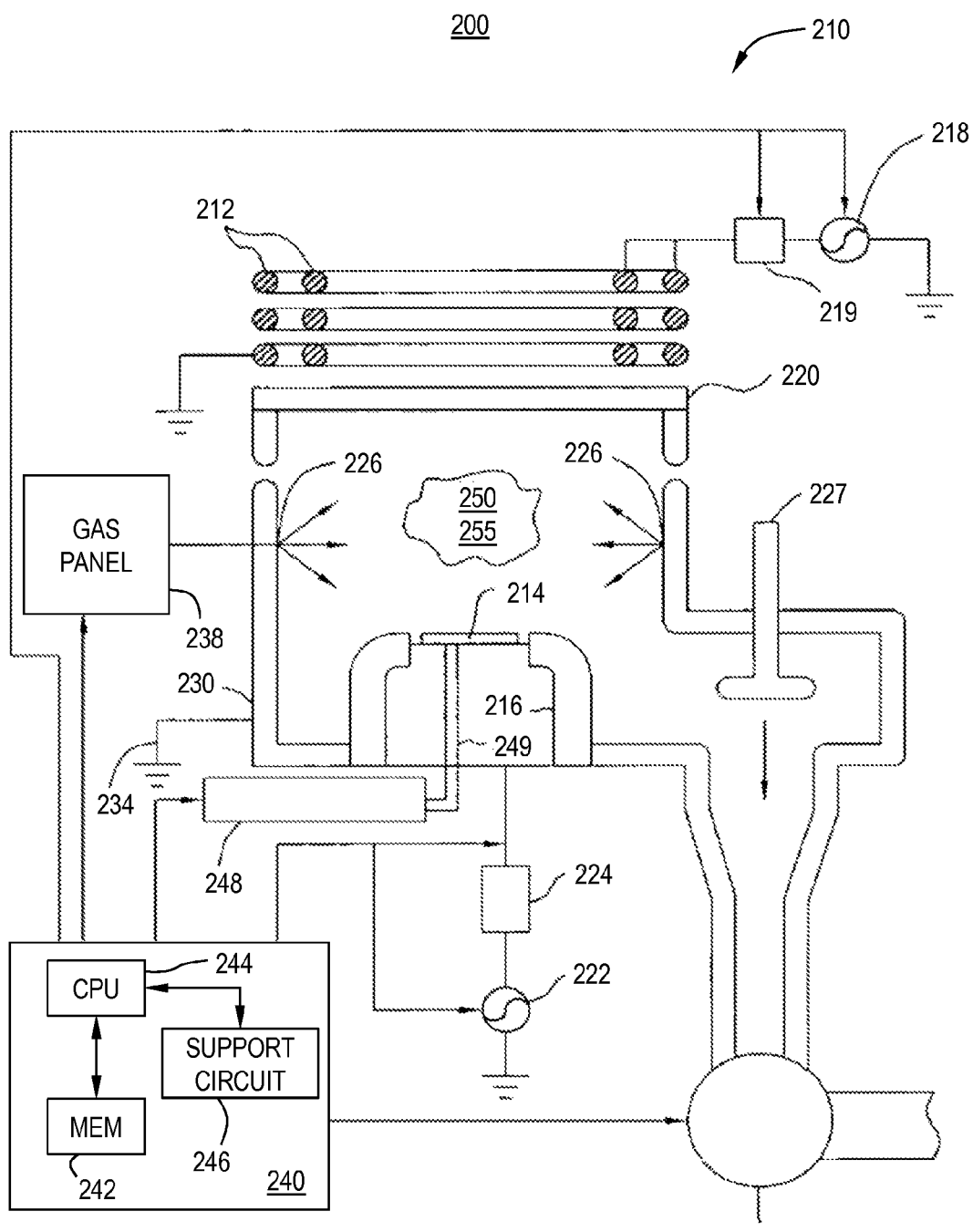
FIG. 2 shows a schematic view of a functionalization chamber in accordance with one or more embodiment of the invention.

A schematic, cross-sectional diagram of an exemplary functionalization chamber is shown in FIG. 2. The functionalization chamber shown is an inductive plasma source reactor that is merely an example of reactors that may be used. It will be understood by those skilled in the art that this plasma source is merely illustrative and should not be taken as limiting the scope of the invention. The reactor 200 comprises a process chamber 210 having a wafer support pedestal 216 within a conductive body (wall) 230, and a controller 240. The chamber 210 shown is supplied with a substantially flat dielectric ceiling 220. Other modifications of the chamber 210 may have other types of ceilings, e.g., a dome-shaped ceiling. Above the ceiling 220 is disposed an antenna comprising at least one inductive coil element 212 (two co-axial elements 212 are shown). The inductive coil element 212 is coupled, through a first matching network 219, to a plasma power source 218. The plasma source 218 typically is capable of producing up to 3000 W at a tunable frequency in a range of about 10 kHz to about 100 MHz. In some embodiments, the plasma source 218 operates at a frequency in the range of about 50 kHz to about 60 MHz, or at a frequency of about 2 MHz, 13.56 MHz, 40 MHz or 60 MHz.

The support pedestal (cathode) 216 is coupled, through a second matching network 224, to a biasing power source 222. The biasing power source 222 is generally capable of producing a RF signal having a tunable frequency in the range of about 10 kHz to about 100 MHz. In some embodiments, the frequency is in the range of about 50 kHz to about 60 MHz, or about 2 MHz, 13.56 MHz, 40 MHz or 60 MHz. The power source 222 can operate at a power of between 0 and 5000 Watts. However, it may be disconnected during processing. Optionally, the biasing power source 222 may be a DC or pulsed DC source. A controller 240 comprises a central processing unit (CPU) 244, a memory 242, and support circuits 246 for the CPU 244 and facilitates control of the components of the chamber 210 and, as such, of the functionalization process.

In operation, a semiconductor wafer 214 is placed on the pedestal 216 and process gases are supplied from a gas panel 238 through entry ports 226 to form a gaseous mixture 250. The gaseous mixture 250 is ignited into a plasma 255 in the chamber 210 by applying power from the plasma source 218. The pressure within the interior of the chamber 210 is controlled using a throttle valve 227 and a vacuum pump 236. Typically, the chamber wall 230 is coupled to an electrical ground 234. The temperature of the wall 230 is controlled using liquid-containing conduits (not shown) that run through the wall 230.

The entry ports 226 are shown as a side inject chamber in which the gas is flowed into the processing region from the side. This is merely illustrative of one possible gas introduction schema. In some embodiments, the process gases are supplied through one or more of a showerhead, vortex funnel or hybrid system. The manner of gas distribution does not matter so long as there is a somewhat uniform distribution of gases across the substrate surface.

The temperature of the wafer 214 is controlled by stabilizing a temperature of the support pedestal 216. In one embodiment, gas (e.g., helium) from a gas source 248 is provided via a gas conduit 249 to channels (not shown) formed in the pedestal surface under the wafer 214. The gas is used to facilitate heat transfer between the pedestal 216 and the wafer 214. During processing, the pedestal 216 may be heated by a resistive heater (not shown) within the pedestal to a steady state temperature and then the gas facilitates uniform heating of the wafer 214. Using such thermal control, the wafer 214 is maintained at a temperature in the range of about 20 to 350° C.

To facilitate control of the process chamber 210 as described above, the controller 240 may be one of any form of general-purpose computer processor that can be used in an industrial setting for controlling various chambers and sub-processors. The memory 242, or computer-readable medium, of the CPU 244 may be one or more of readily available memory such as random access memory (RAM), read only memory (ROM), floppy disk, hard disk, or any other form of digital storage, local or remote. The support circuits 246 are coupled to the CPU 244 for supporting the processor in a conventional manner. These circuits include cache, power supplies, clock circuits, input/output circuitry and sub-systems, and the like. The inventive method is generally stored in the memory 242 as a software routine. The software routine may also be stored and/or executed by a second CPU (not shown) that is remotely located from the hardware being controlled by the CPU 244.

The power source 218 can be any suitable source including an un-modulated ionizing source power waveform which is generated by a plasma power source 218 of FIG. 2. The power can be operated at radio frequency (RF). In some embodiments, a square-wave modulated (or pulsed) ionizing source power waveform is employed. The power modulation frequency is typically turned on and off at kHz frequency. The peak RF power is typically in the range of about 50 watts to about 3000 watts. The duty cycle of the modulations (or pulses) is in the range of about 5% to about 90% and the ionizing power may be varied in the range of about 0% to about 100% to generate the desired mean temperature of the constituents of the plasma and to reduce damage that may occur to the substrate. The functionalization process is typically operated at pressure between about 1 mTorr to about 1 Torr. The gas comprising the functionalization element can have a flow rate is the range of about 50 sccm to about 20 slm. In addition to the functionalization element, a diluent or non-reactive gas can be co-flowed into the chamber. Typical diluent gases include, but are not limited to, helium, neon, argon, krypton and xenon, to sustain the plasma and to modify the electron temperature. The inert gas flow rate may be in the range of about 0 sccm and about 20 slm.

It should be noted that the plasma can be created by various ionizing power sources, which may, for example, include an inductively coupled power source, a capacitatively coupled power source, a surface wave power source, an electronic cyclotron resonance source (ECR source), magnetron or modified magnetron-type sources, or other ionizing sources that may be used to facilitate plasma generation in a processing chamber. A surface wave power source is a very high frequency (100 MHz to 10 GHz) plasma source, in which the gas collision frequency is much less than the electromagnetic wave frequency, such that the electromagnetic power is absorbed into the plasma by a "surface-wave" or "wave-heating" based energy transfer mechanism. Such a source would typically include a very high frequency power source, a wave guide connecting the power source to the chamber, a dielectric chamber wall and an arrangement of openings or slots adjacent to the dielectric wall in which the very high frequency power is coupled in to the chamber. Microwave ionization power source is a type of surface wave power source.

It may be particularly efficient to avoid exposure of the substrate to the ambient environment between processing steps. As used in this specification and the appended claims, the term "ambient environment" refers to the environment in the manufacturing facility or air. In some embodiments, each of the cleaning, functionalizing and forming of a (silicon layer and) silicon dioxide layer are performed in separate processing chambers with each chamber connected to a centralized transfer chamber. The substrate can be moved between the individual processing chambers by a robot without exposure to the ambient environment.

In some embodiments, the substrate is cleaned before functionalization. The surface cleaning can be any suitable cleaning that removes the oxide layer from the substrate without leaving an undesirable residue on the substrate. In some embodiments, the substrate is subjected to an atomic hydrogen cleaning process to form the clean substrate surface prior to functionalization. Atomic hydrogen cleaning is a process known to those skilled in the art. Briefly, the substrate is exposed to a hydrogen plasma or hydrogen radicals which react with the surface oxide to form water. The water vapor is removed from the cleaning chamber, leaving a bare substrate (also referred to as a clean substrate). To prevent formation of an oxide layer on the now clean substrate surface, the substrate is functionalized without be exposed to oxygen or air.

The substrate may be subjected to further processing after functionalization. In some embodiments, a silicon dioxide film is formed on the functionalized substrate surface. In some embodiments, the silicon dioxide film is formed directly on the functionalized substrate surface. The thickness of the deposited silicon dioxide film can vary depending on the use of the device being formed. In some embodiments, the silicon dioxide film has a thickness up to about 5 nm, or up to about 4 nm, or up to about 3 nm or up to about 2 nm or up to about 1 nm.

In one or more embodiments, the silicon dioxide film is formed over a silicon film which is formed directly on the functionalized substrate surface. The silicon film can have any suitable thickness depending on the use of the device being formed. In some embodiments, the silicon film has a thickness up to about 2 nm, or up to about 1 nm, or up to about 0.7 nm. In one or more embodiments, the silicon film has a thickness in the range of about 0.1 nm to about 1.0 nm, or in the range of about 0.2 nm to about 0.9 nm, or in the range of about 0.3 nm to about 0.8 nm, or in the range of about 0.4 nm to about 0.7 nm, or about 0.6 nm.

Without being bound by any particular theory of operation, it is believed that depositing a silicon layer on the functionalized surface followed by a silicon dioxide layer can prevent oxidation of the underlayer. The silicon dioxide film can also act as a sacrificial layer, allowing the substrate to be exposed to air or oxygen without causing oxidation. The silicon dioxide layer can be removed prior to further device manufacturing processes.

In some embodiments, the silicon layer and/or silicon dioxide layer is deposited by atomic layer deposition. During an atomic layer deposition (ALD) process, reactant gases are introduced into a process chamber containing a substrate. Generally, a region of a substrate (or all of the substrate) is contacted with a first reactant which is adsorbed onto the substrate surface. The substrate is then contacted with a second reactant which reacts with the first reactant to form a deposited material. A purge gas may be introduced between the delivery of each reactant gas to ensure that the only reactions that occur are on the substrate surface.

In some embodiments, one or more layers may be formed during a plasma enhanced atomic layer deposition (PEALD) process. In some processes, the use of plasma provides sufficient energy to promote a species into the excited state where surface reactions become favorable and likely. Introducing the plasma into the process can be continuous or pulsed. In some embodiments, sequential pulses of precursors (or reactive gases) and plasma are used to process a layer. In some embodiments, the reagents may be ionized either locally (i.e., within the processing area) or remotely (i.e., outside the processing area). In some embodiments, remote ionization can occur upstream of the deposition chamber such that ions or other energetic or light emitting species are not in direct contact with the depositing film. In some PEALD processes, the plasma is generated external from the processing chamber, such as by a remote plasma generator system. The plasma may be generated via any suitable plasma generation process or technique known to those skilled in the art. For example, plasma may be generated by one or more of a microwave (MW) frequency generator or a radio frequency (RF) generator. The frequency of the plasma may be tuned depending on the specific reactive species being used. Suitable frequencies include, but are not limited to, 2 MHz, 13.56 MHz, 40 MHz, 60 MHz and 100 MHz. Although plasmas may be used during the deposition processes disclosed herein, it should be noted that plasmas may not be required. Indeed, other embodiments relate to deposition processes under very mild conditions without a plasma.

Figure 3:
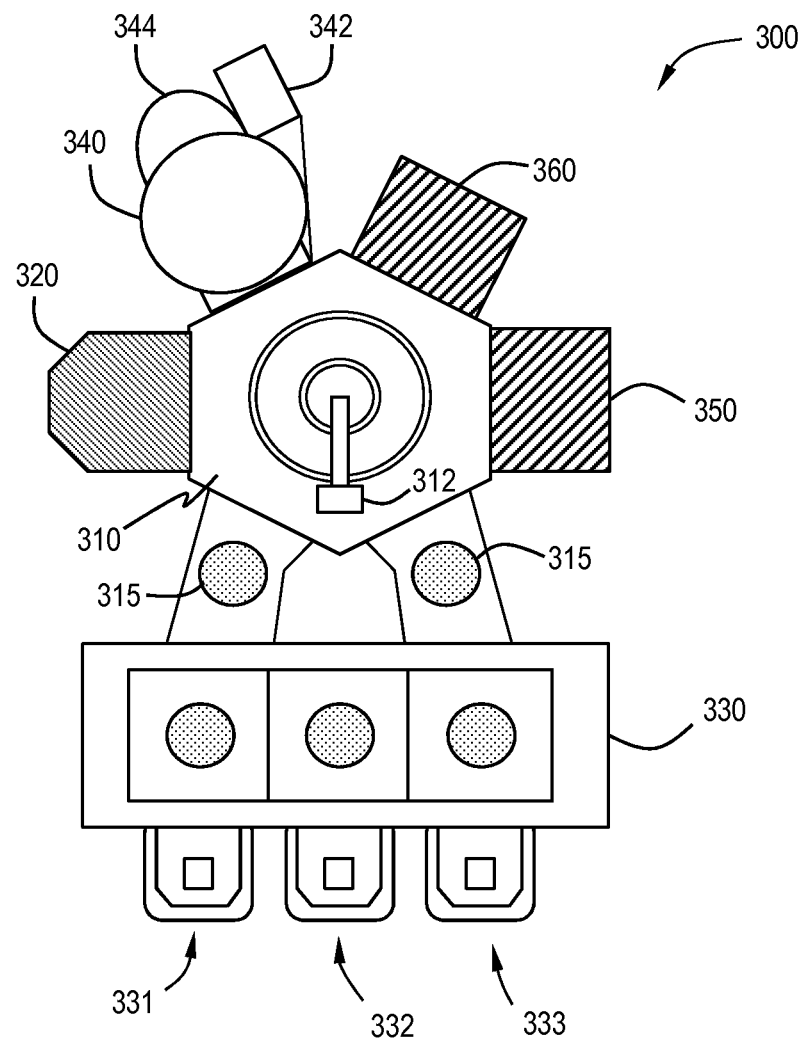
FIG. 3 shows a schematic view of a cluster tool in accordance with one or more embodiments of the invention.

Additional embodiments of the invention are directed to a cluster tool useful for preparing the functionalized substrate. Generally, a cluster tool is a modular system comprising multiple chambers which perform various functions including substrate center-finding and orientation, degassing, annealing, deposition and/or etching. Referring to FIG. 3, a cluster tool 300 includes at least a first chamber and a central transfer chamber 310. The central transfer chamber 310 may house a robot 312 that can shuttle substrates between and among processing chambers and load lock chambers 330. The transfer chamber 310 is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. The details of one such staged-vacuum substrate processing apparatus is disclosed in U.S. Pat. No. 5,186,718, entitled "Staged-Vacuum Wafer Processing Apparatus and Method," Tepman et al., issued on Feb. 16, 1993. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, preclean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided. Additionally, oxidation after processing or prior to depositing a subsequent film can be avoided.

The cluster tool 300 includes a load lock 330 connected to a front of the central transfer station 310. The load lock 330 forms a barrier between the central transfer station 310 and the ambient environment. Commonly, a load lock 330 will include multiple sections 331, 332, 333 which are used concurrently. This allows one section to be pumped down from atmospheric conditions which a second section is in use and the third section is being brought back to ambient conditions.

The cluster tool 300 shown includes an atomic hydrogen cleaning 320 chamber connected to the central transfer station 310. The robot 312 moves the substrate 315 into the atomic hydrogen cleaning 320 chamber where the oxide layer is removed. The robot 312 then moves the substrate 315 from the atomic hydrogen cleaning 320 chamber to the functionalization chamber 340. The functionalization chamber 320 is in fluid communication with a functionalizing gas 342 and is connected to the central transfer station 310. The functionalization chamber 340 includes a plasma generator 344 which forms a plasma of the functionalization gas. The plasma can be formed directly within the functionalization chamber 340 or can form the plasma remotely from the functionalization chamber 340 and flow the gas into the functionalization chamber 340.

After functionalization in the functionalization chamber 340, the robot 312 moves the substrate 315 to a first atomic layer deposition chamber 350 connected to the central transfer station 310 to deposit a silicon dioxide film. Additionally, the substrate 315 can be moved to a second atomic layer deposition chamber 360 connected to the central transfer station 310 to deposit a silicon film. The number, positioning and order the processing chambers shown are merely illustrative and should not be taken as limiting the scope of the invention. Additionally, a second transfer chamber (not shown) can be connected to the central transfer station 310 with additional processing chamber connected to the second transfer chamber. This allows a substrate to be routed to many different processing chambers without being exposed to ambient conditions.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants from a processing chamber. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, like a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposure to different reactive or purge gases. Rotating the substrate during processing (either continuously or in steps) may help produce a more uniform deposition or etch by minimizing the effect of, for example, local variability in gas flow geometries.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A method of functionalizing a surface of a substrate, the method comprising exposing a clean surface of the substrate to a functionalizing element to form a functionalized substrate surface, the substrate selected from the group consisting of silicon, germanium and silicon germanium, and the functionalizing element selected from the group consisting of sulfur, selenium and mixtures thereof.

2. The method of claim 1, wherein the functionalizing element comprises sulfur.

3. The method of claim 2, wherein the sulfur is generated by a plasma of one or more of hydrogen sulfide and sulfur selenide.

4. The method of claim 1, wherein the functionalizing element comprises selenium.

5. The method of claim 4, wherein the selenium is generated by a plasma of one or more of hydrogen selenide and sulfur selenide.

6. The method of claim 5, wherein the plasma is pulsed.

7. The method of claim 1, further comprising exposing the substrate surface to an atomic hydrogen cleaning process to form the clean substrate surface.

8. The method of claim 6, wherein the clean substrate surface is exposed to the functionalizing element without exposure to oxygen.

9. The method of claim 1, further comprising forming a silicon dioxide film on the functionalized substrate surface.

10. The method of claim 1, further comprising forming a silicon film on the functionalized substrate surface.

11. The method of claim 9, further comprising forming a silicon dioxide film on the silicon film.

12. A method of forming a gate stack on a surface of a substrate, the method comprising:
    cleaning the surface of the substrate with an atomic hydrogen cleaning process to form a clean substrate surface;
    functionalizing the clean substrate surface with a functionalizing element to form a functionalized substrate surface, the functionalizing element selected from the group consisting of sulfur, selenium and combinations thereof; and
    forming a silicon dioxide layer on the functionalized substrate surface,
    wherein the substrate is selected from the group consisting of silicon, germanium and silicon germanium and the substrate is not exposed to ambient conditions until after forming the silicon dioxide layer.

13. The method of claim 11, further comprising forming a silicon layer between the functionalized substrate surface and the silicon dioxide layer.

14. The method of claim 11, wherein the functionalizing element comprises sulfur.

15. The method of claim 13, wherein the sulfur is generated by a plasma of one or more of hydrogen sulfide and sulfur selenide.

16. The method of claim 11, wherein the functionalizing element comprises selenium.

17. The method of claim 15, wherein the selenium is generated by a plasma of one or more of hydrogen selenide and sulfur selenide.

18. The method of claim 11, wherein each of the cleaning, functionalizing and forming of a silicon dioxide layer are performed in separate processing chambers, each chamber attached to a centralized transfer chamber and moved between the chambers by a robot without exposure to the ambient environment.

* * * * *